US 11,473,835 B2

(12) United States Patent
Hanson

(10) Patent No.: US 11,473,835 B2
(45) Date of Patent: Oct. 18, 2022

(54) GLASS FRONT DOOR WITH EMBEDDED USER INTERFACE

(71) Applicant: Electrolux Home Products, Inc., Charlotte, NC (US)

(72) Inventor: Josh Hanson, Huntsville, NC (US)

(73) Assignee: Electrolux Home Products, Inc., Charlotte, NC (US)

( * ) Notice: Subject to any disclaimer, the term of this patent is extended or adjusted under 35 U.S.C. 154(b) by 0 days.

(21) Appl. No.: 16/840,940

(22) Filed: Apr. 6, 2020

(65) Prior Publication Data
US 2021/0310728 A1 Oct. 7, 2021

(51) Int. Cl.
*F25D 23/02* (2006.01)
*F25D 29/00* (2006.01)
*F25D 27/00* (2006.01)
*G06F 3/041* (2006.01)

(52) U.S. Cl.
CPC ........ *F25D 29/005* (2013.01); *F25D 23/028* (2013.01); *F25D 27/005* (2013.01); *G06F 3/0412* (2013.01); *F25D 2323/02* (2013.01)

(58) Field of Classification Search
CPC .... F25D 23/028; F25D 27/005; F25D 29/005; G06F 3/0412
USPC ......................................................... 312/405
See application file for complete search history.

(56) References Cited

U.S. PATENT DOCUMENTS

| 6,260,255 B1* | 7/2001 | Richardson ........... A47F 3/0434 29/458 |
| 8,424,985 B2 | 4/2013 | Kwon et al. |
| 10,295,248 B2 | 5/2019 | Miller et al. |
| 10,386,115 B2 | 8/2019 | Seo et al. |
| 10,393,426 B2 | 8/2019 | Seo et al. |
| 10,670,329 B2 | 6/2020 | Kang et al. |
| 11,015,864 B2 | 5/2021 | Kang et al. |
| 11,248,836 B2 | 2/2022 | Kang et al. |
| 2011/0304252 A1* | 12/2011 | Stubblefield .......... A47F 3/0434 312/405 |
| 2012/0286638 A1* | 11/2012 | Lee ........................ F25D 23/02 312/405 |
| 2016/0061514 A1* | 3/2016 | Seo ........................ F25D 11/02 312/404 |

FOREIGN PATENT DOCUMENTS

EP 2131128 12/2009

* cited by examiner

Primary Examiner — James O Hansen
(74) Attorney, Agent, or Firm — Pearne & Gordon LLP

(57) ABSTRACT

A refrigeration appliance includes a cabinet defining a food storage compartment being at least partially closeable by a door-in-door assembly including an inner door sealing against the cabinet and an outer door sealing against the inner door. The inner door has an opening extending therethrough in communication with the compartment when the inner door is closed. The outer door includes a window extending therethrough being covered at an inner side by an inner pane of glass and at an outer side by an outer pane of glass covering a majority of a front of the outer door to provide the effect of a full glass door. A user interface (UI) is disposed in the outer door and is configured to control appliance features upon selective user contact with the outer pane. The door assembly includes a light element for illuminating at least one of the outer pane and the compartment.

19 Claims, 9 Drawing Sheets

GLASS FRONT DOOR WITH EMBEDDED USER INTERFACE

FIELD OF THE INVENTION

This application relates generally to a glass door for a refrigeration appliance, and more particularly, to a glass door having an embedded user interface for access by a user at an outer surface of the glass door.

BACKGROUND OF THE INVENTION

Conventional refrigeration appliances, such as domestic refrigerators, typically have both a fresh food compartment and a freezer compartment or section. The fresh food compartment is where food items such as fruits, vegetables, and beverages are stored. The freezer compartment is where food items that are to be kept in a frozen condition are stored. The refrigerators are provided with refrigeration systems that maintains the fresh food compartment at temperatures above 0° C., such as between 0.25° C. and 4.5° C. and the freezer compartments at temperatures below 0° C., such as between 0° C. and −20° C.

The arrangements of the fresh food and freezer compartments with respect to one another in such refrigerators vary. For example, in some cases, the freezer compartment is located above the fresh food compartment and in other cases the freezer compartment is located below the fresh food compartment. Additionally, many modern refrigerators have their freezer compartments and fresh food compartments arranged in a side-by-side relationship. Whatever arrangement of the freezer compartment and the fresh food compartment is employed, typically, separate access doors are provided for the compartments so that either compartment can be accessed without exposing the other compartment to the ambient air.

These conventional refrigeration appliances have solid, insulated doors that close the respective compartment(s). The doors are heavily insulated to aid in maintaining the temperature within the compartment(s) within an acceptable temperature range. These doors are typically opaque.

Differently, grocery stores typically utilize refrigeration appliances where a door of the appliance is made of glass. The glass allows the grocery store the ability to present products for sale in an aesthetically pleasing manner and allows consumers to view the products prior to opening the door to retrieve the desired product. These doors typically are poorly insulated, though this is not a great concern in grocery stores as the loss of cool air is compensated for by using large refrigeration systems and by the economic sale of the purchased items. Alternatively, it is impractical and costly to use large refrigeration systems for refrigeration appliances that are intended only for household or smaller commercial use, and thus insulation and energy efficiency are of greater desire.

Nonetheless, the ability to discern what is inside the appliance prior to opening is a benefit that would be desired for translation to household and smaller commercial use. Such feature would provide for minimized time with the appliance open to ambient air, thus reducing energy costs and providing a more stable internal environment of the refrigerator. Somewhat problematically, such translation is counter to presence of user-activated external controls and other features that are present on newer conventional refrigeration appliances, such as domestic refrigerators. These controls can provide for user-specific control of the compartment temperature(s), to control energy costs and desired refrigeration, or can allow for internal lighting adjustment, setting of timers or ice production, and entering/exiting a Sabbath mode, among other functions. The controls are typically at least partially visible, even when provided through a front plastic/metal fascia element, taking away from the aesthetic of an unobstructed appliance front face.

BRIEF SUMMARY OF THE INVENTION

Aspects of the present disclosure can address one or more of the deficiencies or desires described above by providing a refrigeration appliance having an aesthetically pleasing door assembly that can provide for viewing internal contents of the appliance while also providing adequate insulation of the respective compartment.

Disclosed is a refrigeration appliance, such as a refrigerator, and preferably a domestic refrigerator, that includes a cabinet defining a food storage compartment being at least partially closeable by a door-in-door assembly including an inner door sealing against the cabinet and an outer door sealing against the inner door. The inner door has an opening extending therethrough in communication with the compartment when the inner door is closed. The outer door includes a window extending therethrough being covered at an inner side by an inner pane of glass and at an outer side by an outer pane of glass. The outer door provides an aesthetically pleasing construction presenting as a full glass door to the user while also providing controls via a user interface. The outer door, including the glass panes, is selectively openable relative to the inner door to allow partial access into the refrigerator when opened and also viewing of internal contents when closed.

In accordance with one aspect, a refrigeration appliance includes a cabinet defining a compartment for storing food items in a refrigerated environment, and a door for selectively closing at least a portion of the compartment. The door has an inner side facing towards the compartment when the door is in a closed position engaged with the cabinet and an external side disposed opposite thereof. The door includes a body pivotably coupled to the cabinet and defining a window extending through the body, an inner pane of glass at the inner side of the door at the window, an outer pane of glass at the external side of the door and at least partially closing the window, and a user interface disposed in the body. The outer pane covers a majority of a front of the door and has a rear surface being affixed at a front surface of the body.

In accordance with another aspect, a refrigeration appliance includes a cabinet defining a compartment for storing food items in a refrigerated environment, and a door assembly for selectively closing at least a portion of the compartment. The door assembly includes an inner door and an outer door provided in a stacked arrangement, the doors being configured such that either only the outer door can be opened or the inner and outer doors can be jointly opened to obtain access to the compartment. The inner door is pivotably coupled to the cabinet for selectively engaging with the cabinet. The inner door has an inner door opening extending therethrough that is in communication with the compartment when the inner door is in a closed position engaged with the cabinet. The outer door is pivotably coupled to at least one of the cabinet or the inner door for selectively engaging an outer side of the inner door to close one side of the inner door opening. The outer door includes an outer door body defining a window extending therethrough that allows for viewing of the compartment through the inner door opening when the door assembly is selectively closed against the cabinet, an inner pane of glass at an inner side of the window, an outer pane of glass affixed to an outer front surface of the body and covering the window, and a user interface retained within the outer door body and having capacitive elements activated via a user contacting specific areas of a front surface of the outer pane of glass.

In accordance with yet another aspect, a door assembly for a refrigeration appliance includes an inner door configured to be pivotably coupled to a body of the refrigeration appliance and having an inner door opening extending therethrough for allowing access from a front of the inner door to a rear of the inner door. The door assembly further includes an outer door provided against the inner door in stacked arrangement therewith. The outer door is configured to be pivotably coupled to at least one of the inner door or the body of the refrigeration appliance such that either only the outer door can be selectively pivoted from engagement with a front surface of the inner door or both the inner and outer doors can be jointly pivoted together in their stacked arrangement relative to the body of the refrigeration appliance. The outer door includes a rear portion and a front portion spaced from one another by an intermediate portion, and each of the rear, front and intermediate portions being integral with one another. The intermediate portion defines a pocket between the rear portion and the front portion, and the rear and front portions each have a window extending therethrough in communication with the pocket. An outer pane of glass is affixed to a front surface of the front portion and covers the window through the front portion. At least one inner pane of glass is disposed in the pocket and extends along and closing the window through the front portion. A user interface is disposed in the intermediate portion and has a front face affixed to a rear side of the outer pane of glass, where the user interface is disposed vertically beneath the at least one inner pane of glass.

The foregoing and other features of the invention are hereinafter described in greater detail with reference to the accompany drawings.

BRIEF DESCRIPTION OF THE DRAWINGS

The accompanying drawings, which are not necessarily to scale, show various aspects of the disclosure.

DESCRIPTION OF EXAMPLE EMBODIMENTS

Figure 1:
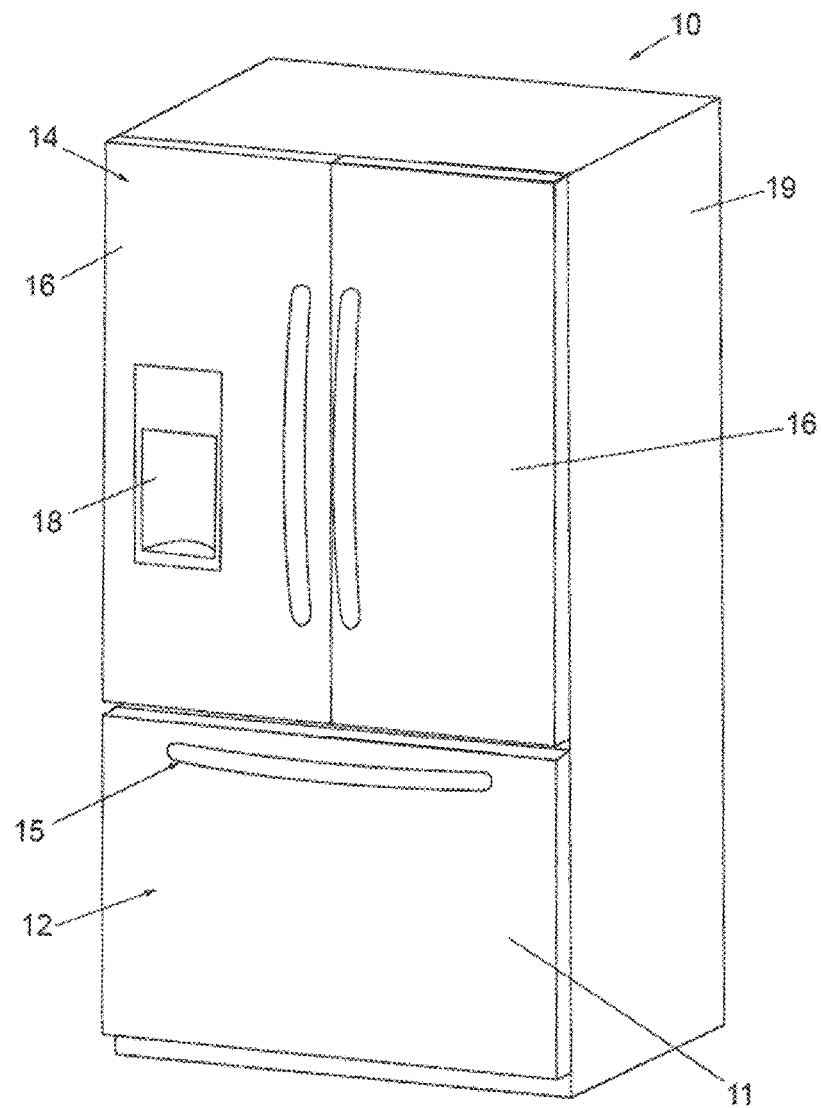
FIG. 1 is a front perspective view of a prior art household French door bottom mount refrigeration appliance showing doors of the fresh food compartment and drawer of a freezer compartment in a closed position.

Embodiments of a refrigerator or a component thereof now will be described with reference to the accompanying drawings. Whenever possible, the same reference numerals are used throughout the drawings to refer to the same or like parts.

Figure 2:
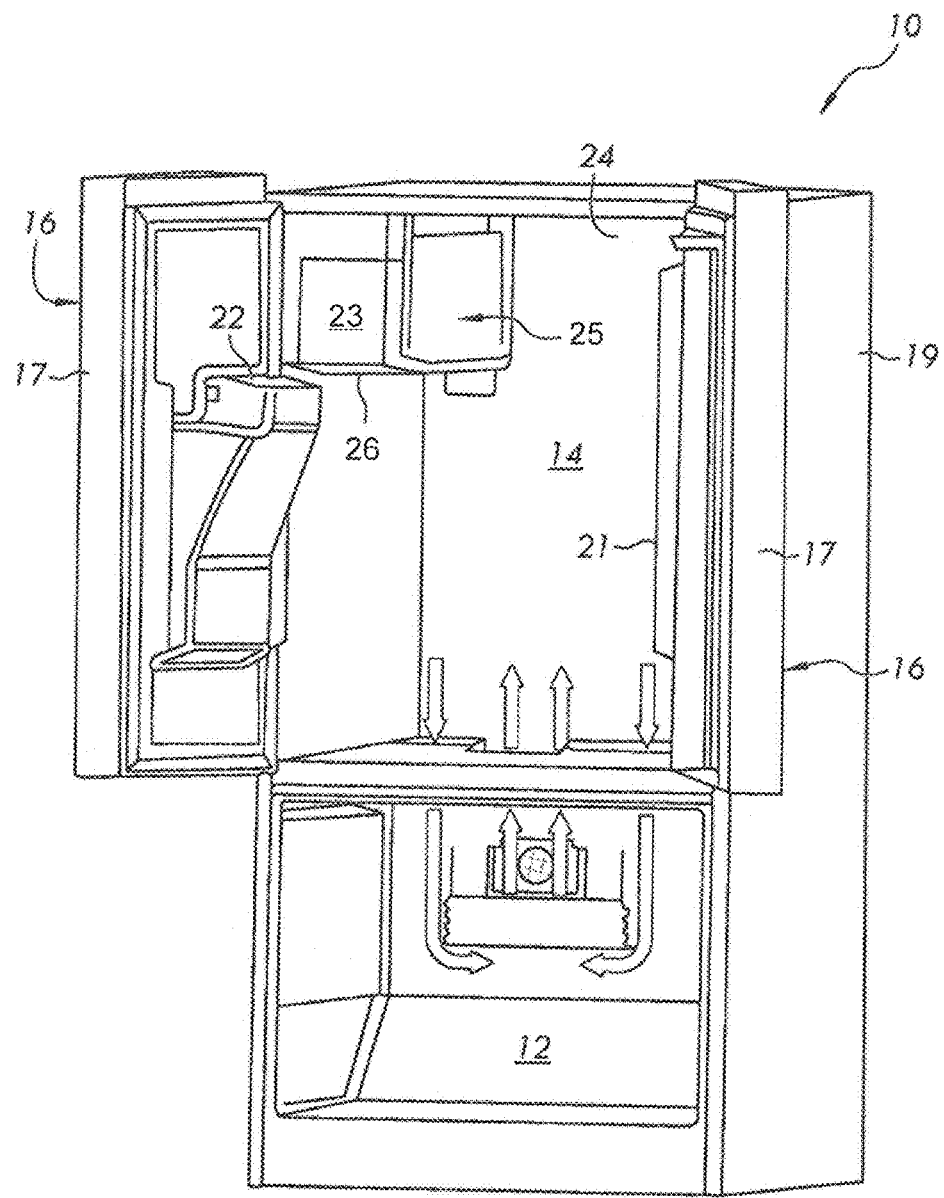
FIG. 2 is a front perspective view of the prior art refrigeration appliance of FIG. 1 showing the doors of the fresh food compartment in opened positions and the drawer of the freezer compartment removed.

Referring now to the drawings, FIGS. 1 and 2 show a refrigeration appliance in the form of a domestic refrigerator, indicated generally at 10. Although the detailed description that follows concerns a domestic refrigerator 10, the invention can be embodied by refrigeration appliances other than a domestic refrigerator 10. An embodiment is described in detail below, and shown in the figures as a bottom-mount configuration of a refrigerator 10, including a fresh food compartment 14 disposed vertically above a freezer compartment 12. However, the refrigerator 10 can have any desired configuration including at least a fresh food compartment 14 and/or a freezer compartment 12, such as a top mount refrigerator (freezer disposed above the fresh food compartment), a side-by-side refrigerator (fresh food compartment is laterally next to the freezer compartment), a standalone refrigerator or freezer, etc.

One or more doors 16 shown in FIG. 1 are pivotably coupled to a cabinet 19 of the refrigerator 10 to restrict and grant access to the fresh food compartment 14. The door 16 can include a single door that spans the entire lateral distance across the entrance to the fresh food compartment 14, or can include a pair of French-type doors 16 as shown in FIG. 1 that collectively span the entire lateral distance of the entrance to the fresh food compartment 14 to enclose the fresh food compartment 14.

For the latter configuration, a center flip mullion 21 (FIG. 2) is pivotally coupled to at least one of the doors 16 to establish a surface against which a seal provided to the other one of the doors 16 can seal the entrance to the fresh food compartment 14 at a location between opposing side surfaces 17 (FIG. 2) of the doors 16. The mullion 21 can be pivotably coupled to the door 16 to pivot between a first orientation that is substantially parallel to a planar surface of the door 16 when the door 16 is closed, and a different orientation when the door 16 is opened. The externally-exposed surface of the center mullion 21 is substantially parallel to the door 16 when the center mullion 21 is in the first orientation and forms an angle other than parallel relative to the door 16 when the center mullion 21 is in the second orientation. The seal and the externally-exposed surface of the mullion 21 cooperate approximately midway between the lateral sides of the fresh food compartment 14.

A dispenser 18 (FIG. 1) for dispensing at least ice pieces, and optionally water, can be provided on an exterior of one of the doors 16 that restricts access to the fresh food compartment 14. The dispenser 18 includes an actuator (e.g., lever, switch, proximity sensor, etc.) to cause frozen ice pieces to be dispensed from an ice bin 23 (FIG. 2) of an ice maker 25 disposed within the fresh food compartment 14. Ice pieces from the ice bin 23 can exit the ice bin 23 through an aperture 26 and be delivered to the dispenser 18 via an ice chute 22 (FIG. 2), which extends at least partially through the door 16 between the dispenser 18 and the ice bin 23.

The freezer compartment 12 is arranged vertically beneath the fresh food compartment 14. A drawer assembly (not shown) including one or more freezer baskets (not shown) can be withdrawn from the freezer compartment 12 to grant a user access to food items stored in the freezer compartment 12. The drawer assembly can be coupled to a freezer door 11 that includes a handle 15. When a user grasps the handle 15 and pulls the freezer door 11 open, at least one or more of the freezer baskets is caused to be at least partially withdrawn from the freezer compartment 12.

In alternative embodiments, the ice maker is located within the freezer compartment. In this configuration, although still disposed within the freezer compartment, at least the ice maker (and possible an ice bin) is mounted to an interior surface of the freezer door. It is contemplated that the ice mold and ice bin can be separate elements, in which one remains within the freezer compartment and the other is on the freezer door.

The freezer compartment 12 is used to freeze and/or maintain articles of food stored in the freezer compartment 12 in a frozen condition. For this purpose, the freezer compartment 12 is in thermal communication with a freezer evaporator (not shown) that removes thermal energy from the freezer compartment 12 to maintain the temperature therein at a temperature of 0° C. or less during operation of the refrigerator 10, preferably between 0° C. and −50° C., more preferably between 0° C. and −30° C. and even more preferably between 0° C. and −20° C.

The refrigerator 10 includes an interior liner 24 (FIG. 2) that defines the fresh food compartment 14. The fresh food compartment 14 is located in the upper portion of the refrigerator 10 in this example and serves to minimize spoiling of articles of food stored therein. The fresh food compartment 14 accomplishes this aim by maintaining the temperature in the fresh food compartment 14 at a cool temperature that is typically above 0° C., so as not to freeze the articles of food in the fresh food compartment 14. It is contemplated that the cool temperature preferably is between 0° C. and 10° C., more preferably between 0° C. and 5° C. and even more preferably between 0.25° C. and 4.5° C.

According to some embodiments, cool air from which thermal energy has been removed by the freezer evaporator can also be blown into the fresh food compartment 14 to maintain the temperature therein greater than 0° C. preferably between 0° C. and 10° C., more preferably between 0° C. and 5° C. and even more preferably between 0.25° C. and 4.5° C. For alternate embodiments, a separate fresh food evaporator can optionally be dedicated to separately maintaining the temperature within the fresh food compartment 14 independent of the freezer compartment 12.

According to an embodiment, the temperature in the fresh food compartment 14 can be maintained at a cool temperature within a close tolerance of a range between 0° C. and 4.5° C., including any subranges and any individual temperatures falling with that range. For example, other embodiments can optionally maintain the cool temperature within the fresh food compartment 14 within a reasonably close tolerance of a temperature between 0.25° C. and 4° C.

Figure 3:
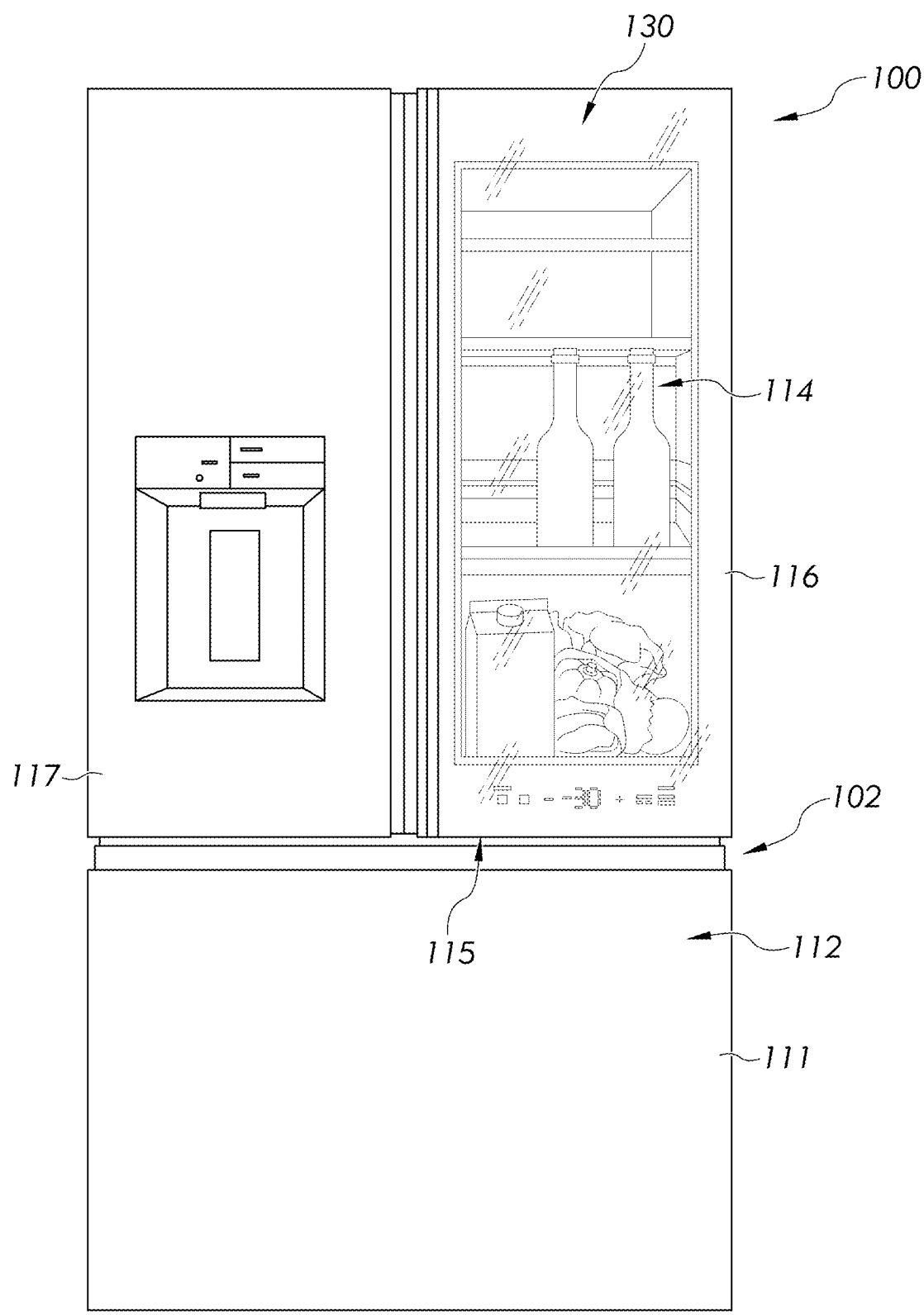
FIG. 3 is a front perspective view of a refrigeration appliance according to the present disclosure.

Turning now to FIG. 3, another refrigerator 100 is illustrated. The refrigerator 100 is substantially similar to the refrigerator 10 discussed above except as discussed below. Aspects of the refrigerator 100 that are similar to aspects of the refrigerator 10 are identified with the same reference numbers but indexed by 100. It will be appreciated that aspects of the refrigerator 10 can be incorporated into the refrigerator 100 and vice versa.

The refrigerator 100 includes a cabinet 102, also referred to herein as a cabinet body, defining a compartment 114 for storing food items in a refrigerated environment. Generally, the refrigerator includes at least one door 116 for selectively closing a cabinet opening 115 of the compartment 114, at a forward portion of the cabinet 102. As illustrated, two doors 116 and 117 are included for selectively opening and closing the compartment 114, which can be a fresh food compartment for storing food in a cold environment above freezing. Each of the doors 116 and 117 are pivotably coupled to the cabinet 102, such as by hinges or other suitable mechanical system. A freezer compartment 112 is disposed beneath the fresh food compartment 114, and is selectively closed by a door 111, which is part of a respective drawer assembly. Other configurations of doors, drawers and compartments can be used in other embodiments, for example, where the freezer compartment and/or a variable temperature compartment can include multiple doors or drawers, etc.

Generally, at least one of the doors 116 and 117, and as illustrated the right door 116, comprises an assembly that addresses one or more deficiencies of doors of conventional refrigerator appliances for consumer or domestic use. For the discussion herein, the assembly includes two doors in a stacked arrangement front-to-back and being pivotable relative to one another, sometimes referred to as a door-in-door assembly. However, it is to be understood that the construction of the user interface could similarly be applied to a single door version (i.e., non-door-in-door) of a more conventional French-door configuration.

This door-in-door of the present embodiment is configured to allow for visibility of at least a portion of the interior compartment 114 without opening of any door to the compartment 114, together with control of one or more functions of the refrigeration appliance 100, and lighting of the door-in-door and compartment 114. The door-in-door in some embodiments also can provide limited storage of items in the refrigerated environment that can be retrieved from the more exterior door of the door-in-door without exposing the entire compartment 114 to the ambient environment at the exterior of the refrigeration appliance 100. As used herein, "door-in-door" can refer to an assembly having a door received into another door, onto another door, or a combination thereof.

While the other fresh food compartment door 117 and the freezer compartment door 111 do not include respective windows or door-in-door assemblies, it is contemplated that these doors 117 and 111 additionally or alternatively could include such feature in other embodiments.

Figure 4:
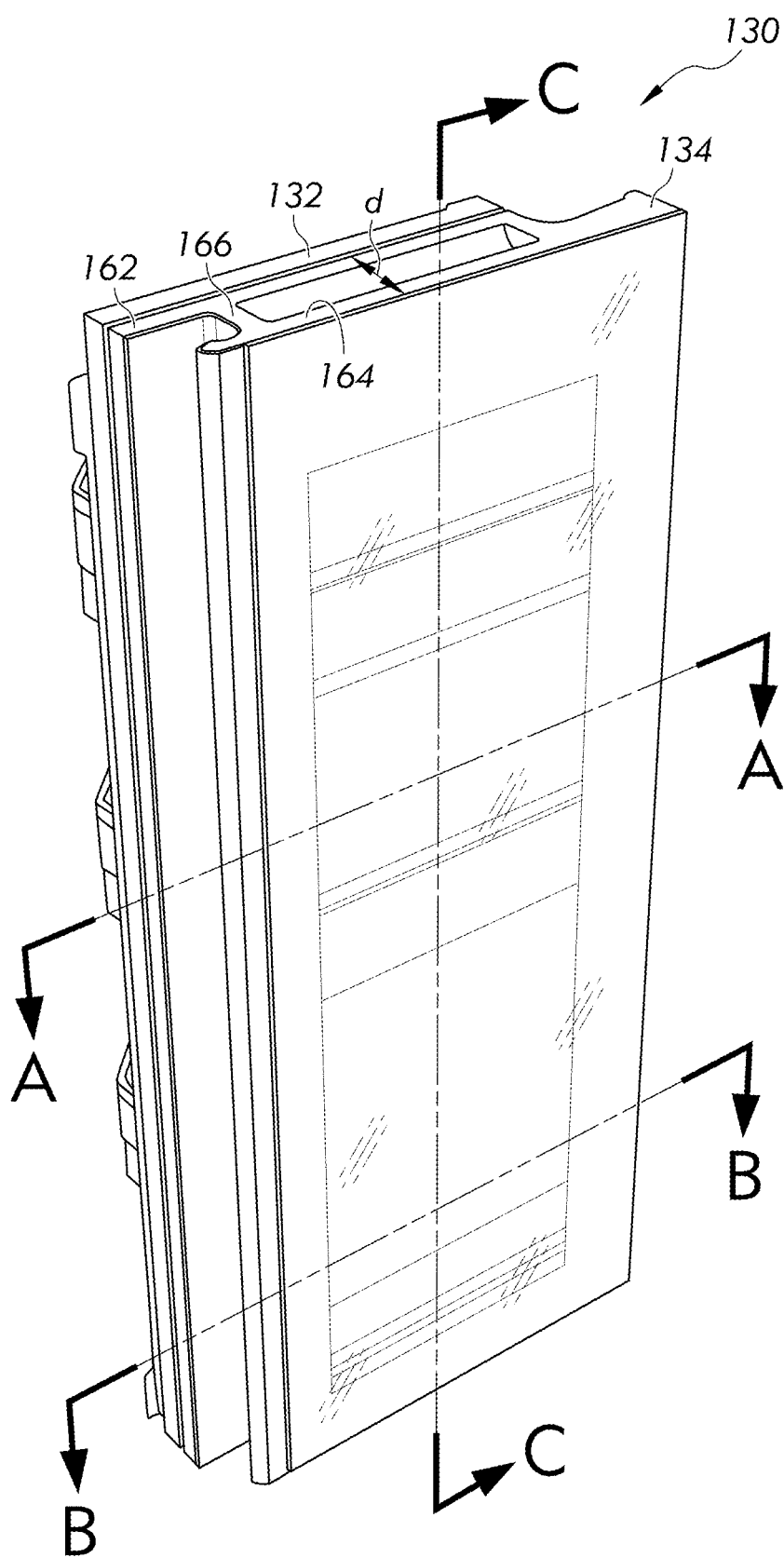
FIG. 4 is a front perspective view of a door assembly according to the present disclosure, also of the refrigeration appliance of FIG. 3.
Figure 5:
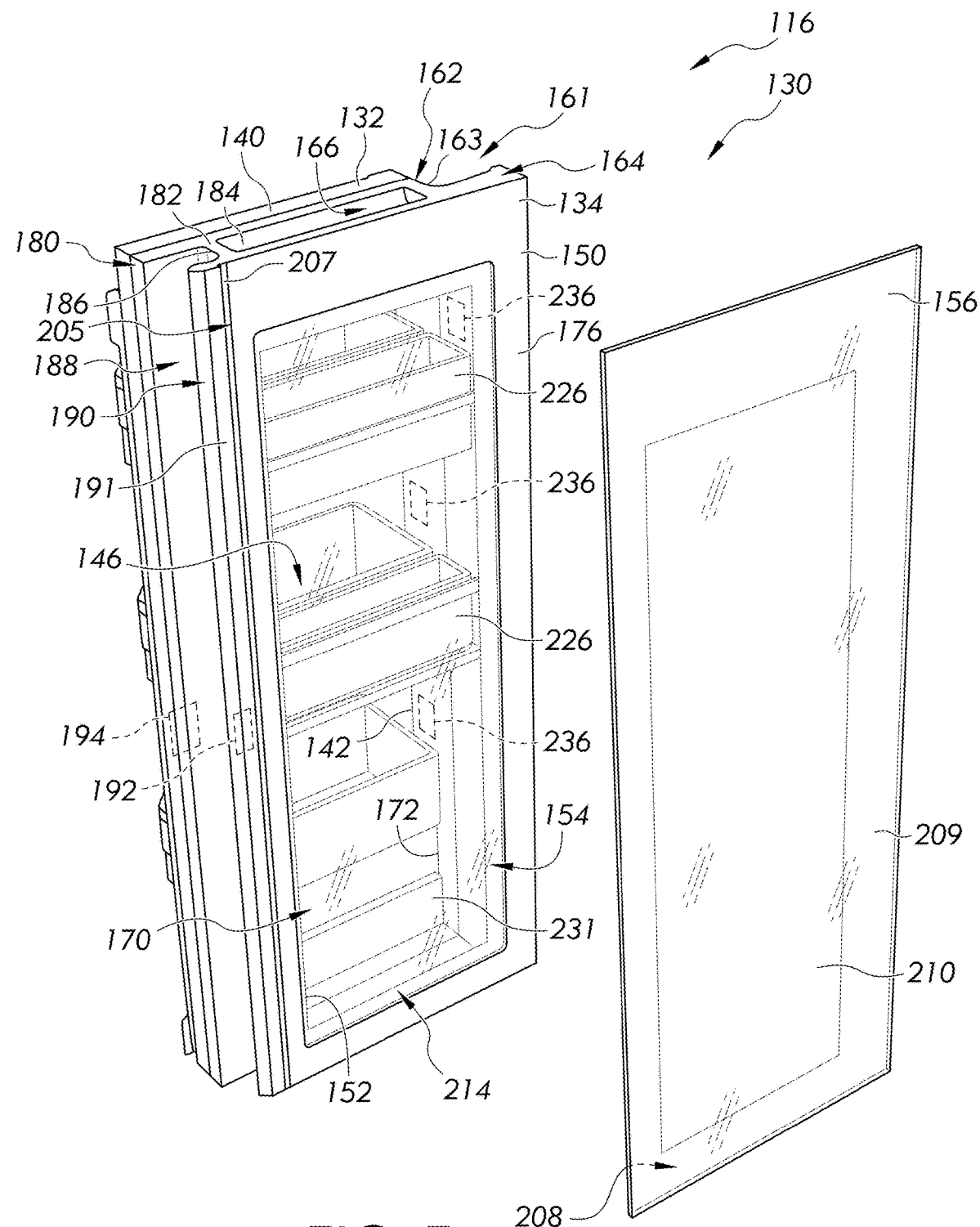
FIG. 5 is a front perspective view of the door assembly of FIG. 4 with the outer pane of glass separated from the remainder of the door assembly.

Turning now to FIGS. 4 and 5, but also still referring to FIG. 3, the door 116 specifically provides a door-in-door assembly 130 comprising an inner door 132 and an outer door 134. Herein, the assembly 130 can be referred to as a "door", though containing multiple openable elements, such as doors. The inner and outer doors 132 and 134 are provided in a stacked arrangement. The doors 132 and 134 are configured such that either only the outer door 134 can be opened or the inner and outer doors 132 and 134 can be jointly opened to obtain access to the compartment 114. Generally, a window 152 is defined by the outer door 134 for selectively allowing a user to view contents of the fresh food compartment 114, as described below in further detail.

It will be appreciated that outer/front and inner/rear designations are indicated with respect to closed alignment of the doors 132 and 134 against the cabinet 102 when used in the typical refrigerator use case.

The inner door 132 is pivotably coupled to the cabinet 102, such as by a suitable hinge (not shown), for selectively engaging with and sealing against the cabinet 102. A rear side of the inner door 132 can include any suitable sealing assembly, such as at least a perimeter gasket, for providing said sealing. The inner door 132 can optionally include a central flip mullion (not shown) that provides sealing of the compartment 114 centrally between the doors 116 and 117 when both are closed against the cabinet 102. Alternatively, the flip mullion could be located upon the other fresh food door (i.e., door 117).

The inner door 132 includes an inner door body 140 defining an inner door opening 142 extending through the inner door body 140. The inner door body 140 generally provides a perimeter framing structure with the inner door opening 142 defining the major vertically extending and horizontally extending extents of the inner door 132. The inner door body 140 is insulated, such as via a solid, pre-formed expanded polystyrene (EPS), or a similar material, or alternatively, can be filled with a liquid expanding foam that cures rigid. In particular, either an expanding foam or a solid EPS provides both insulating and additional rigidity to the frame structure of the inner door body 140.

The inner door opening 142 is open to the compartment 114 when the inner door 132 is in a closed position engaged with the cabinet 102. One or more storage elements 146, such as shelves or bins, can be suitably attached to the inner door 140, such as extending into the inner door opening 142. These storage elements 146 can be removable and/or rearrangeable. Additionally or alternatively, one or more storage elements can be formed integrally with an aspect of the inner door 132. When the inner door 140 is in the closed position, these storage elements 146 will retain food items within the chilled fresh food compartment.

Turning now to the outer door 134, said door includes an outer door body 150, at least one inner pane of glass 154, an outer pane of glass 156, and an electronic user interface 160 used to display information and/or make operational changes to the refrigerator.

The outer door body 150 is pivotably coupled to at least one of the cabinet 102 or the inner door 132, such as by a hinge (not shown), for selectively engaging an outer side of the inner door 132 to close the inner door opening 142. The inner and outer doors 132 and 134 can be pivotable via the same one or more complex hinges, so that the inner and outer doors 132, 134 are independently moveable relative to each other and to the fresh food compartment. A horizontal outer side 161 of the outer door body 150 defines a recess 163, such as for receiving hinge structures for the inner and outer doors 132 and 134.

The outer door body 150 generally has a greater depth along a depth dimension d (FIG. 4) than the inner door 132 and provides the window 152 therethrough. The window 152 is positioned to correspond to the inner door opening 142 when the doors 132 and 134 both are closed. Particularly, the depicted outer door body 150 includes a rear portion 162 providing a rear framing structure, a front portion 164 providing a front framing structure, and an intermediate portion 166 disposed therebetween. The intermediate portion 166 defines a pocket 170 between the rear and front portions 162 and 164. The framing structure of the rear portion 162 defines a rear window 172, while the front portion 164 defines the window 152. Each of the front, rear and intermediate portions 164, 162 and 166 are integral with one another.

Each of the window 152, rear window 172, pocket 170 and inner door opening 142 are correspondingly aligned with one another, with each extending vertically along a vertical extent of the others. That is, when the doors 132 and 134 are correspondingly closed against one another and against the cabinet 102, each of the window 152, rear window 172, pocket 170 and inner door opening 142 are in fluid and visual communication with one another and with the compartment 114. This allows for cooling of products stored at the door 116 and viewing of the internal contents of the compartment 114 from outside the refrigeration appliance 100, as will be further detailed below.

The front window 152 is at least partially defined by a front panel 176 of the outer door 134, so that the front panel 176 provides a front surface of the body 150. A rear panel 180 is disposed opposite of the front panel 176. A rear side of the rear panel 180 can include any suitable sealing assembly, such as at least a perimeter gasket, for providing sealing against the inner door 132. The sides of the outer door 134, including the outer surfaces of the intermediate portion 166, can be formed by depth-wise extending extensions of one or both of the front panel 176 and the rear panel 180, and/or can be at least partially formed by separate side panels interconnected with one or both of the front and rear panels 176, 180.

Upper and lower endcap assemblies 182 extend between the front and rear panels 176, 180 at vertically upper and vertically lower aspects of the outer door 134. As illustrated at FIGS. 4 and 5, the upper endcap assembly 182 can include integral therewith an upper recess 184 defining a handle for opening at least the outer door 134 relative to the body/cabinet 102. This upper recess 184 extends generally horizontally along the outer door 134.

Optionally, another recess 186 can be formed at a horizontal-inner side 188 of the outer door 134, generally adjacent the pocket 170. This side recess 186 can extend along a full vertical length of the outer door 134 such that the endcap assemblies 182 also each at least partially define the side recess 186. In some embodiments, the side recess 186 can extend less than a full vertical length of the outer door 134.

The illustrated side recess 186 at least partially defines a handle for opening at least the outer door 134 relative to the body/cabinet 102. Additionally defining the handle, a vertically inner extent of the front portion 164 terminates in an elongated bar 190 to provide an ergonomic grip for the handle. The bar 190 can be coupled to the remaining aspects of the outer door 134, such as to the front portion 164 or to the front surface 176, or can be formed integral with an aspect of the outer door 134.

A sleeve 191 can be disposed over the elongated bar 190 in some embodiments. The sleeve 191 and bar 190 can be coupled to one another by any suitable method such as by fasteners or by interlocking tabs and grooves. The sleeve 191 can be made from a different material and/or have a different surface finish than the material and/or the finish of the bar 190 to provide an aesthetically pleasing appearance. In the embodiment shown, the bar 190 has a circular cross section between opposite ends of the bar 190. It is contemplated that the bar 190 can have other cross sectional shapes, e.g., square, oval, rectangular, etc. or have a cross section that varies along the length of the bar 190 between the vertical ends of the bar 190. It also is contemplated that the bar 190 can extend along any suitable vertical length of the outer door 134.

As shown at FIG. 5, the recess 186 includes a button 192 or other hand-operable actuator that is coupled with a latch 194. The latch 194 can be provided by any suitable structure for coupling the outer door 134 to the inner door 132. The button 192 can be any of a mechanical tactile push button, electronic switch or capacitive button, etc. and is correspondingly coupled to the latch 194, such as mechanically, electrically, etc. as is suitable. In some embodiments additional latches can be included and/or the latch 194 may be otherwise suitably located, such as at a periphery of one of the inner door 132 or the outer door 134. In some embodiments the upper recess 184 can additionally include a button or can alternatively include the button 192 in place of the side recess 186.

The latch 194 includes a default coupled or closed orientation, coupling the inner and outer doors 132 and 134 to one another. Thus, when a user pulls on one of the upper recess 184 or side recess 186, both inner and outer doors 132 and 134 are opened together as the joint assembly 130 to provide direct access to internal contents of the compartment 114. Contrarily, when a user grasps the handle at the side recess 186 and also pushes or activates the button 192, the latch 194 releases the outer door 134 from the inner door 132, allowing only the outer door 134 to be selectively opened, such as being pivoted relative to the cabinet 102 and to the inner door 132, with the inner door 132 remaining adjacent the cabinet 102. In one embodiment, the button 192 and/or latch 194 can be fully located within the recess 186 so as to be hidden from view when a user is located in front of the respective refrigerator. The elongated bar 190 and/or sleeve 191 can help to hide the button and/or latch 192, 194.

Looking still to FIGS. 4 and 5, the outermost (frontmost) surface of the door assembly 130, i.e., the portion of the door assembly 130 facing a user when the door assembly 130 is in the closed position, is provided by the outer pane 156 of glass, such as decorative glass (sometimes referred to as deco glass). The outer pane 156 is affixed to the front panel 176 at an outer periphery of the outer pane 156, such as by a cured adhesive. In such case, the adhesive preferably is disposed at a rear surface 208 of the outer pane 156, such as at an outer peripheral portion 209 of the outer pane 156. This outer peripheral portion 209 can be configured to hide or to obscure the adhesive or other fastening. That is, in addition or alternatively, the outer pane 156 can be secured to and supported upon the front panel 176 by mechanical features, such as clips, clasps, clamps, screws, bolts, projections, lips/ledges, magnets, etc.

The outer pane 156 is shaped to provide a majority of the front surface of the outer door 134. For example, the outer pane 156 covers the entire window 152 at the front surface of the door 116. As shown at FIG. 4, the outer pane of glass 156 can be coterminous with at least a pair of edges of the body 150 at the front of the door 134, such as the opposing top and bottom edges 202 and 204. Preferably, the outer pane 156 is coterminous with each of the top edge 202, bottom edge 204 and horizontal outer side edge 206 of the front of the door 134, extending along a majority of a full length of each of these edges 202, 204 and 206. That is, the outer pane of glass 156 is coterminous with at least a pair of intersecting edges 202 and 206 or 204 and 206. It is further contemplated that coterminous may include a minor gap or spacing between the outer pane 156 and one or more edges of the door due to manufacturing tolerances and/or to limit impact to an edge of the pane 156 when the door 134 is opened. It also is contemplated that the outer pane 156 can have a height that is approximately a full height of the outer door 134 or approximately ¾ or ⅔ of the height of the outer door 134. Various other sizes are contemplated.

As a result of the foregoing, the outer pane of glass 156 extends over and covers portions of the structure of the body 150 at the front portion 164. A gap, such as a trim break 207 can be disposed between the respective inner lateral edge 205 of the outer pane of glass 156 and the rail 190, or between the respective edge 205 of the glass 156 and the peripheral edge of the door 134 at the side having the handle. In some embodiments, the outer pane of glass 156 can extend in a direction to the handle of the outer door 134, such as nearly to the bar 190, such as omitting or with a smaller trim break 205 than is depicted at FIG. 5.

The outer pane of glass 156 also can extend upward to a portion of the door assembly 130 that overlays hinges that are disposed at a top surface of the cabinet 102. To the user, this coverage can provide the aesthetic of a complete glass door, similar to doors of commercial refrigeration units, such as used at conventional grocery stores.

To further provide this effect, the outer pane 156 can include one or more applications to the rear surface 208 of the outer pane 156. As shown at FIG. 5, the outer peripheral portion 209 of the rear surface 208 that overlays the front panel 176 can be tinted or colored differently, and optionally darker, than a central portion 210 of the rear surface 208 that overlays the window 152. The different tinting can provide for a uniform surface appearance when the outer pane 156 is not backlit, such as presenting that the full door is made of glass with a reduced front panel surface area behind. In some embodiments, the different coloring can be provided by printing at the rear surface 208 of the outer pane 156, such as screen printing, or by a diffusion film applied to the rear surface 208, for example. As mentioned above, the different coloring also can aid in hiding or obscuring adhesive, tape or other fastening from view, which fastening affixes the outer pane 156 to the front panel 176.

It also is contemplated that the rear surface 208 can include a darkened "tinted" effect to conceal the contents of the compartment 114. The tinted effect inhibits ambient light from the exterior environment from illuminating the compartment 114 so that the door 116 has a clean, darkened appearance when the interior lights are not energized. It is contemplated that one or more textures, icons, or screen printing effects can be applied to the rear surface 208, in addition to or alternative to tinting. Any of these effects can be accomplished in various manners, such as via sputter coating, screen printing, applied film, paint, solid frame, etc.

In some embodiments, a portion of the outer pane 156 can have an effect applied that registers with a position(s) of one or more storage bins at the inner door 132 or outer door 134, or with the position of a user interface, to be described below in detail.

It is additionally or alternatively contemplated that an opaque panel, which can include insulation, could be secured or placed in a covering relationship behind the outer pane 156 to provide an exterior appearance of a darkened window 152, while increasing energy efficiency of the appliance 100. In some embodiments, the outer pane 156 can include a low-emissivity coating to decrease heat transfer through the glass.

Moreover, the outer pane 156 is described above as a single pane of deco glass. Though, it is contemplated that the outer pane 156 can be replaced by an insulated glass pack of two or more panes, such as being gas-sealed and containing an inert gas, such as argon or krypton, which are designed to thermally insulate the interior of the cabinet 102 from the surrounding environment. In such case, of course, it is contemplated that the various darkening, low-emissivity, or other coatings or effects can be applied to any of the various panes of such a window pack.

Although a glass pack is contemplated, the preferred embodiment utilizes a single pane of deco glass to allow for the aforementioned customization that can be more easily and efficiently provided to the rear surface 208 of the single outer pane 156. Insulation from the surrounding ambient environment instead is provided by the body 150 and by one or more inner panes of glass 154 secured to the outer door 134 and located behind the outer pane 156. The at least one inner pane 154 is generally provided at the inner side 212 (FIG. 7) of the outer door 134 at the window 152. Preferably, a plurality of inner panes 154 are provided at the window 152 within the pocket 170, generally adjacent the rear surface 208 of the outer pane 156. Each of the inner panes 154 extends parallel to one another and to the outer pane 156.

As shown at FIG. 5, a spacing gap 214 can be dimensioned by the body 150 between the outer pane 156 and the outermost of the inner panes 154, which gap 214 can be a physical and/or thermal gap between the panes. For example, the gap 214 is provided via a thickness of the front portion 164 the front panel 176 and cutout of the window 152. It is contemplated that the gap 214 can be vacuum sealed and/or gas-filled where suitable, or can remain a simple air gap. This gap 214 enables the inner panes 154 to be spaced apart from the outer pane 156 to prevent a directly contiguous placement of the inner panes 154 against the outer pane 156, to thereby reduce optical artifacts that can occur when two panes of glass are in direct contact.

Figure 6:
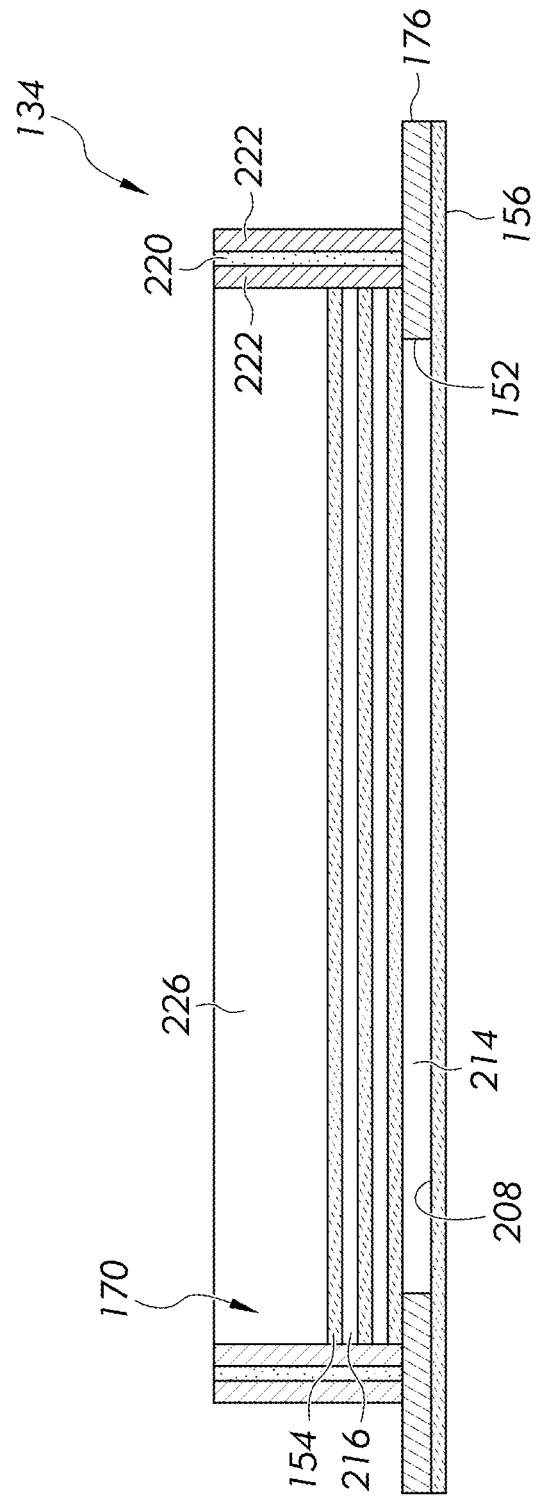
FIG. 6 is a partial horizontal cross-sectional view of the outer door of the door assembly of FIG. 4, taken along line A-A of FIG. 4.
Figure 7:
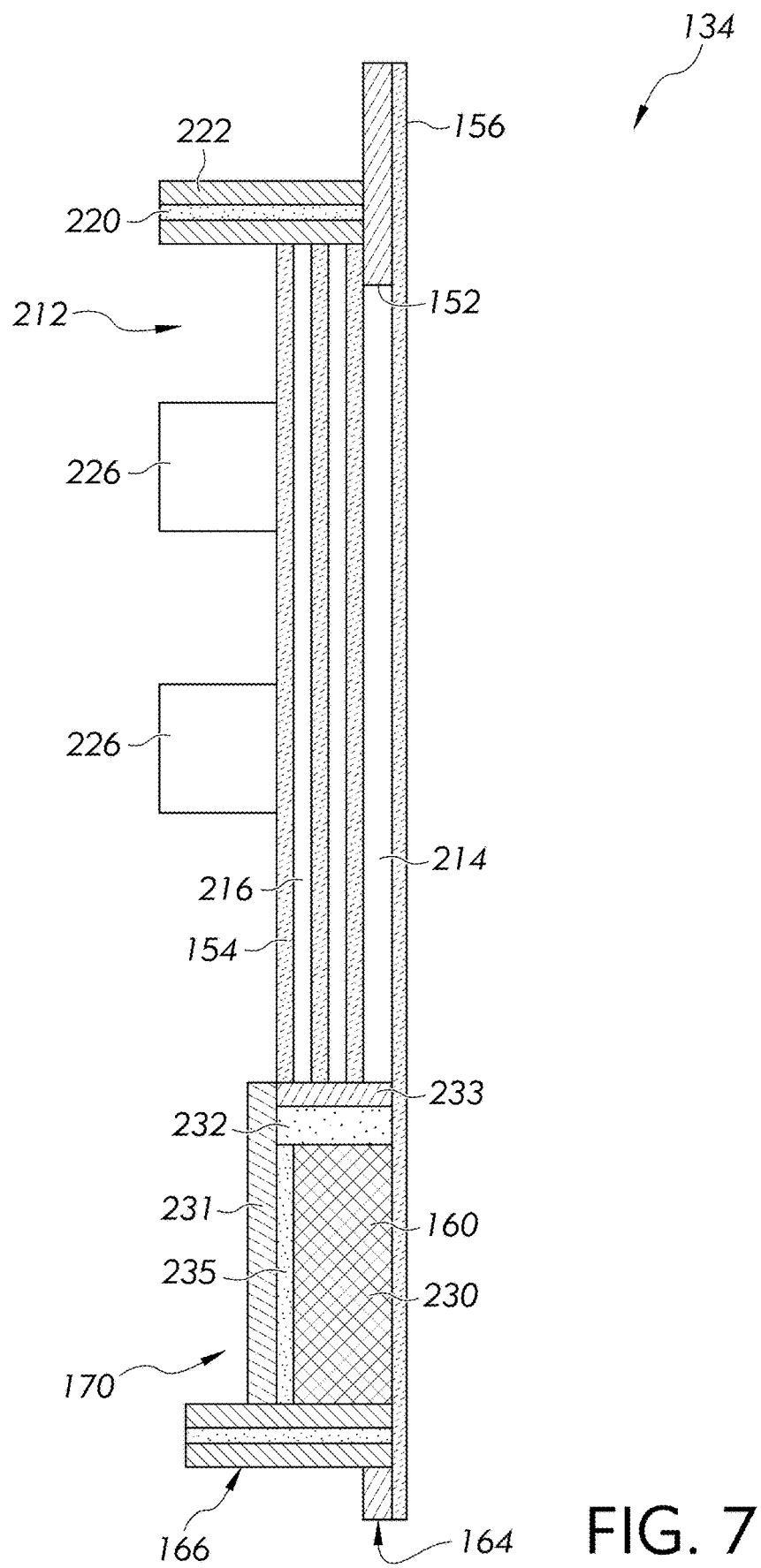
FIG. 7 is partial vertical cross-sectional view of the outer door of the door assembly of FIG. 4, taken along line C-C of FIG. 4.
Figure 8:
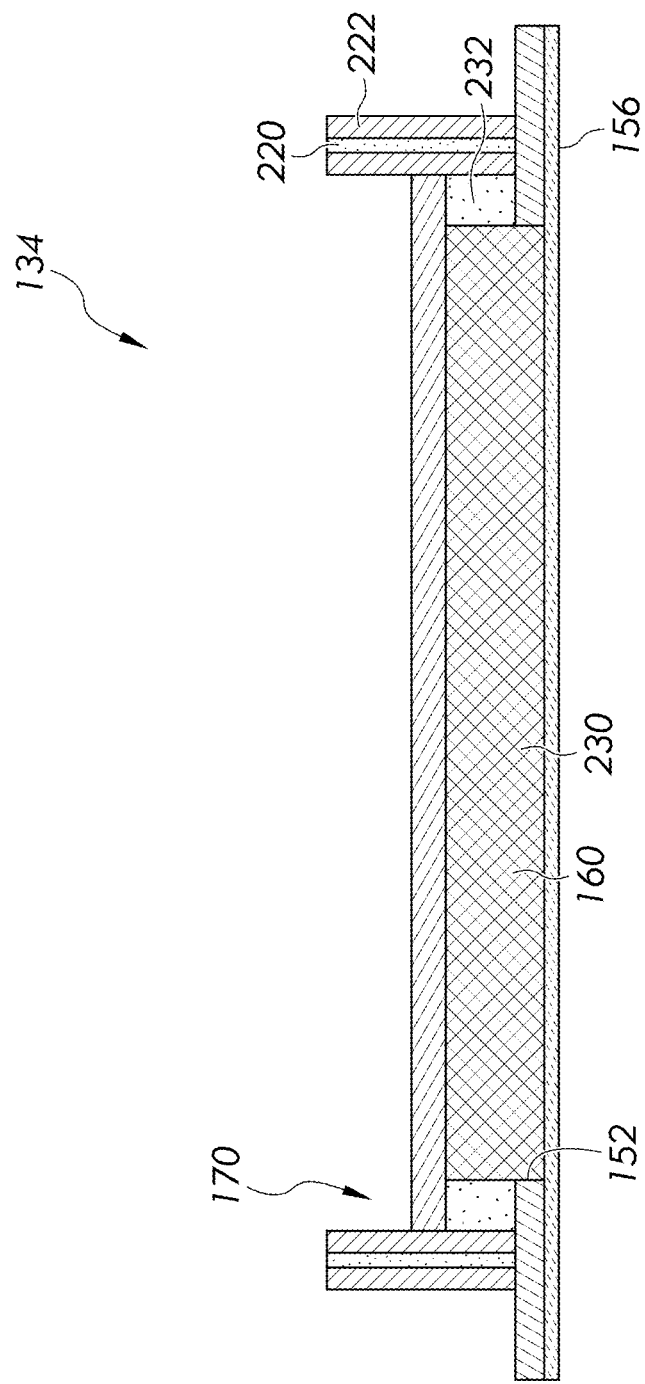
FIG. 8 is a partial horizontal cross-sectional of the outer door of the door assembly of FIG. 4, taken along line B-B of FIG. 4.

Referring now to FIGS. 6-8, varying cross-sections of the door assembly 130 as shown at FIG. 4 are illustrated. These illustrations are schematic and can omit one or more aspects depicted in FIG. 4 to better demonstrate or to more clearly illustrate one or more structures or relative structural relationships discussed below.

Turning first to FIGS. 6 and 7, the inner panes 154 are generically illustrated as a pack of three panes 154. It is contemplated that at least a front pane 154 can be affixed to a rear side of a body portion or rear side of the front panel 176, such as shown in FIG. 6. This can be accomplished by adhesive or other suitable method. In addition or alternatively, the outermost inner pane 154 can be secured to and supported upon the front panel 176 by mechanical features, such as clips, clasps, clamps, screws, bolts, projections, lips/ledges, etc.

Although not shown, a window frame of this pack can surround the outer periphery of each of the inner panes 153 and be mated with internal walls defining the pocket 170. The frame can be made of materials, such as plastic, rubber, silicone, etc. for providing a seal between the body 150 and the pack of panes 154. That is, in some embodiments, the pack of panes 154 can be a single monolithic element but can be made of multiple elements in other embodiments. Whether or not a frame is provided, the panes 154 can be secured to and supported within the body 150 by mechanical features, such as clips, clasps, clamps, screws, bolts, projections, lips/ledges, etc. where suitable.

Whether or not a frame is provided, the panes 154 are depth-wise spaced apart from one another to provide thermal gaps 216 to insulate the compartment 114 and/or to restrict or prevent the aforementioned optical artifacts. These thermal gaps 216 can be vacuum sealed and/or can be gas-sealed and can contain an inert gas, such as argon or krypton. Additional insulation can be provided by one or more of side, top and/or bottom insulation dikes, such as the dikes 220 illustrated in FIG. 6. The insulation dikes 220 can comprise solid, pre-formed expanded polystyrene (EPS), fiberglass, or cavities or pockets could be configured to receive liquid foam insulation that cures rigid. It is noted that although panel portions defining the door assembly 130 are illustrated as separate elements from one another, such as the side panel portions 222 relative to the front panel 176, any two or more of these panels can be integrally formed, and/or one or more panels can be included and/or one of the panels omitted where suitable.

Figure 9:
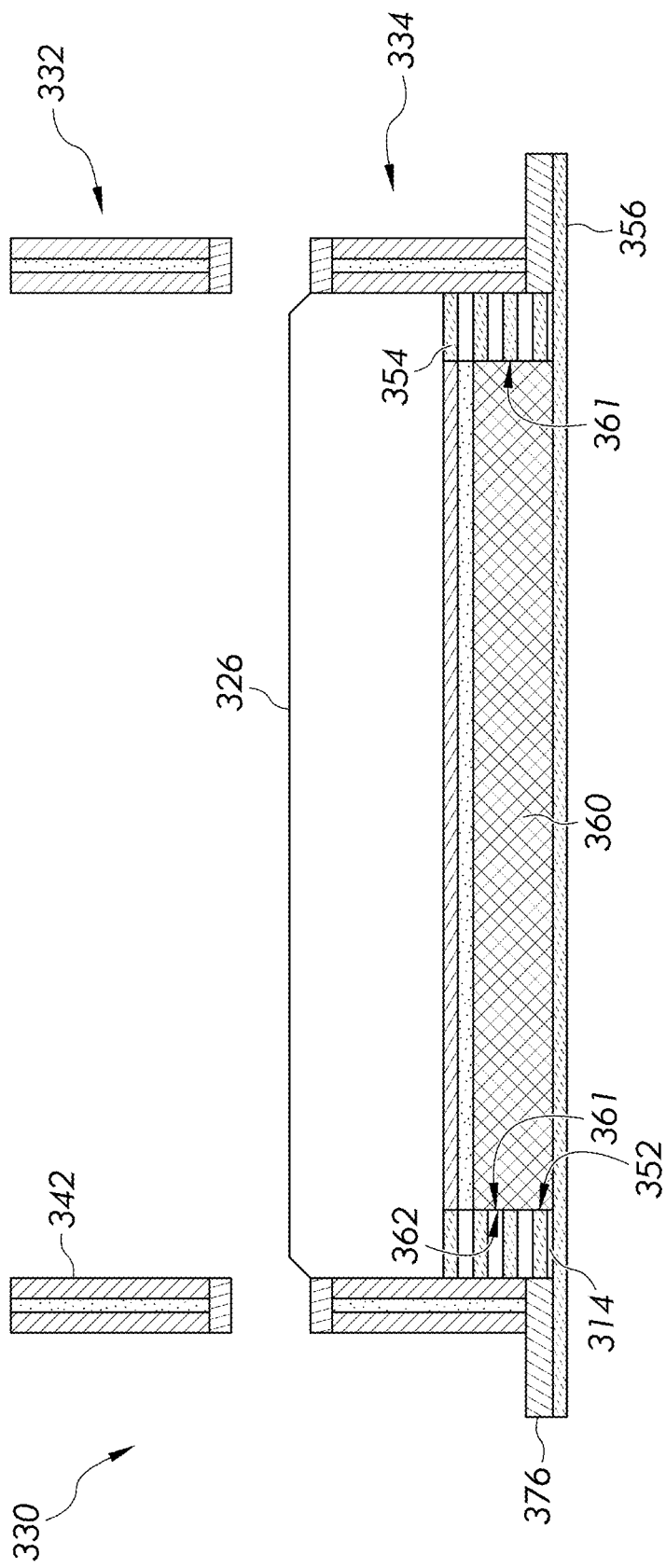
FIG. 9 is a partial horizontal cross-sectional view of another outer door according to the present disclosure, corresponding to a location of line B-B of the similar door assembly of FIG. 4.

In some embodiments, at least one inner pane 154 can be disposed at least partially within the gap 214. For example, as shown at FIG. 9, an inner glass pack can be seated within the window opening 352 of the front panel 376. In other embodiments, an inner pane 154 can be disposed adjacent the outer pane 156, although some optical artifacts may be caused by such arrangement.

Referring to FIGS. 6 and 7, one or more additional storage elements 226, such as shelves or bins, can be retained at the outer door 134, such as at least partially within the pocket 170. These additional storage elements 226 can be removable and/or rearrangeable. Additionally or alternatively, one or more of the additional storage elements 226 can be formed integrally with an aspect of the outer door 134. As shown, the additional storage elements 226 are separate from the storage elements 146 at the inner door 132, though are aligned at the same or similar vertical heights. Thus, when the outer door 134 is opened relative to/without opening the inner door 132, the inner storage elements 146 will remain adjacent the compartment 114 while the outer storage elements 226 will pivot with the outer door 134.

Of course, various other arrangements of storage elements are contemplated. Storage elements can be attached to only one of the inner door 132 or outer door 134. Storage elements can be coupled to one another and/or wholly omitted. Inner storage elements 146 can be disposed at different vertical heights than outer storage elements 226 and vice versa. Storage elements attached to the inner door 132 can extend at least partially into the pocket 170 and/or storage elements attached to the outer door 134 can extend into the inner door opening 142.

Also, as discussed previously, a tinted portion of the outer pane 156 can be located to conceal or inhibit viewing the storage elements 146, 226 and items stored in or on these storage elements 146, 226. As mentioned, this provides a clean appearance to the front of the refrigerator door 116 despite the various items that are stored at the door interior.

Turning next to FIGS. 7 and 8, the inner door 134 further includes the electronic user interface 160, also herein referred to as a UI. The user interface 160 can include any suitable elements, such as a printed circuit board, light guide, an outer fascia, activatable element, light element, sound element, tactile feedback element, readable display such as an "88" display or other electronic display like a LCD, controller, etc. These elements are generally provided within a housing 230 that is retained within the body 150 of the outer door 134. The housing 230 can be insulated, such as by suitable insulation dikes 232, as previously described. Body panels or portions of the body 150 can provide a cavity 234 for the UI 160.

As shown at FIGS. 7 and 8, the UI 160 is disposed at least partially within the pocket 170 which includes the cavity 234, and behind the outer pane 156, such as also being disposed at least partially within the gap 214. The UI 160 is vertically separated from the inner panes 154. Particularly, the UI 160 is disposed vertically below the inner panes 154. The inner panes 154 and UI 160 can be vertically separated by a body element 233 and or an upper insulation section 232 as shown. Likewise, the UI 160 and the respective compartment of the cabinet 102 can be depth-wise separated by a rear body element 231 and a rear insulation section 235. The rear body element 231 and the upper body element 233 can be integral with one another and/or coupled to one another. Likewise, the insulation section 235 and the insulation section 232 can be integral with one another, such as being integrally formed by foamed-in insulation. These body elements 233, 231 and insulation sections 232, 235 aid in providing insulating value at the vertical location of the UI 160 along the door 134. In other embodiments, separation about the UI 160 from the environment and cabinet 102 can at least partially be provided by an air gap, foamed-in insulation, a vacuum panel, etc.

The activatable elements of the UI 160 preferably include capacitive elements (i.e., electric capacitive touch buttons), where the elements can be capacitively electrically controlled through the outer pane 156 via contact of a user, such as a finger, with a selective area of the outer pane 156. In particular, the UI 160 is arranged within the pocket 170 adjacent the rear surface 208 of the outer pane 156, and preferably directly contiguous with the rear surface 208 so that the glass of the outer pane 156 can form a dielectric surface for use with the capacitive elements. In one example, each capacitive element can include at least one spring associated with each capacitive touch button or area on the UI, and such springs be in direct contact with the rear surface 208 of the outer pane 156 (or in direct contact with a coating or layer on the rear surface 208). Optionally, the capacitive elements could include capacitive sliders, which are capacitive elements that can sense motion of a user's finger. Such capacitive sliders can enable a feature set for temperature adjustment and/or lighting effects adjusting brightness level of the interior of the cabinet 102.

In some embodiments, one or more activatable elements can be adhesive-based electronics or can be screen printed, such as with a mesh of metal inks, having electricity applied to the mesh, with the user's finger disrupting the field. These activatable elements can be printed on a film or directly onto the rear surface 208 of the outer pane 156.

The portion of the outer pane 156 overlaying the UI 160 can be tinted or otherwise have an effect applied to the rear surface 208 corresponding to the location of the UI 160. This effect can at least partially hide the features of the UI 160 from a user viewing the front of the refrigeration appliance 100. For example, a diffusion film can be applied to the rear surface 208 or printed to the rear surface 208, which diffusion film can aid in eliminating hot spots from light elements of the UI 160.

It is contemplated that the rear surface 208 of the outer pane 156 can have screen printed icons aligned relative to light elements of the UI 160 so that selected portions of the UI can be illuminated when the UI is operated. For example, in such masking, stenciled areas or windows can be registered with light element locations or a location of the 88 display of the UI 160 relative to the outer pane 156. Additionally or alternatively, icons can be provided at a fascia of the UI 160.

The UI 160, such as the housing 230, can be affixed to the rear surface 208 of the outer pane 156, which can limit or prevent light bleed beyond the outer periphery of a front face of the UI 160. Affixation can be by any suitable method such as adhesives, tape, film, caulk, magnets, etc., such as at the outer periphery of a front face of the UI 160.

In view of the above stacked construction of the UI 160 and the outer pane 156, affixation to the pane 156 and effects applied to the rear surface 208, the user can further be presented with a refrigeration appliance 100 having a door 116 that appears to be a complete glass door, particularly when the door 116 is not backlit or the UI 160 is not lighted.

Communication and/or power cables (not shown) for the UI 160 can be arranged to generally run through the outer door 134 and to the outer hinge recess 163 and then to the cabinet 102. Communication between the UI 160 and other aspects of the refrigeration appliance 100 can be by way of these wires or can be wireless by any suitable method, e.g., Bluetooth, Zigee, cellular, NFC, WiFi, token ring, or the like. In some embodiments, near-field electrical induction can be utilized to power the UI when door is closed.

The UI 160 can be controlled by a UI controller (not specifically shown) that is integral with the UI and/or can be controlled by a separate main controller (not specifically shown) disposed elsewhere at the refrigeration appliance 100. For example, such main controller can communicate with the UI 160 for providing information to a user, e.g., temperature control, interior lighting control, filter status, power status, alerts/alarms, etc., and can also allow the user to input commands to the main controller via the UI 160 to control one or more operations of the refrigerator 100.

Turning briefly again to FIG. 5, the UI 160 as mentioned can contain one or more light elements (not specifically shown) for illuminating the interior of the door assembly 130 and/or portions of the compartment 114 adjacent the door assembly 130. Additionally or alternatively, as shown at FIG. 5, the inner door 132 and/or the outer door 134 can include one or more light elements 236, and/or the cabinet 102 can include one or more light elements 237. These light elements 236 and 237 can be specifically configured, such as using light guides, covers or alignment to illuminate particular aspects of the refrigeration appliance 100, such as the interior of the door assembly 130 and/or portions of the compartment 114 adjacent the door assembly 130, as mentioned. Thus, via activation of one or more of the light elements 236 and 237, together with the glass panes 154 and 156, a user can view internal contents of the door assembly 130/door 116 and compartment 114 prior to opening either the outer door 134 or both the inner and outer doors 132 and 134. It is contemplated that the UI 160 can be configured to allow automatic and/or selective activation of one or more of the light elements 236 or 237, when at least one of the inner door 132 or outer door 134 is opened, or when a button of the UI is activated.

Referring next to FIG. 9, an alternative embodiment of a door assembly 130 for use with the door 116 of the refrigeration appliance 100 is shown at 330 in cross-section. Within the outer door 334 of the door assembly 330, the user interface (UI) 360 is at least partially surrounded on lateral sides 361 by the inner panes 354. That is, different from the door assembly 130, the UI 360 is not vertically separated from the inner panes 354. Rather, the inner panes 354 provide a cutout 362 for receiving the UI 360 therein. The UI 360 also is disposed contiguous with the outer pane 356 at the window 352. In other embodiments, the UI could be disposed fully behind (to the rear of) both an outer pane and one or more inner panes of glass, where suitable, and where a change in an electric field can be sensed across such panes and any intermediate gaps, such as in the case of capacitive activatable elements of the UI.

Also at FIG. 9, the inner panes 354 are at least partially disposed in the window 352 of the front panel 376, with an air gap 314 being disposed between the outer pane 356 and the inner panes 354. This feature, or any one or more of the others illustrated in FIG. 9 being different than those of the outer door 134 previously described, could be included in the door 134. For example, in an embodiment, the inner panes can be at least partially disposed in the window of the front panel, with the respective UI disposed below bottom surfaces of the inner panes.

As further depicted at FIG. 9, a storage element 326 is affixed to the outer door 334 and is configured to extend at least partially into the inner door opening 342 or the inner door 332 when the doors 332 and 334 are closed against one another.

In summary, a refrigeration appliance 100 includes a cabinet 102 defining a food storage compartment 114 being at least partially closeable by a door-in-door assembly 130, 330 including an inner door 132, 332 sealing against the cabinet 102 and an outer door 134, 334 sealing against the inner door 132, 332. The inner door 132, 332 has an opening 142, 342 extending therethrough in communication with the compartment 114 when the inner door 132, 332 is closed. The outer door 134, 334 includes a window 152, 352 extending therethrough being covered at an inner side by an inner pane of glass 154, 354 and at an outer side by an outer pane of glass 156, 356 covering a majority of a front of the outer door 134, 334 and providing the user with the aesthetic effect of a full glass door. A user interface (UI) 160, 360 is disposed in the outer door 134, 334 and is configured to control appliance features upon selective user contact with the outer pane 156, 356, such as at a perimeter of the window 152, 352 where the UI 160, 360 is located. The door assembly 130, 330 can include a light element for illuminating at least one of the outer pane 156, 356 and the compartment 114.

The invention has been described with reference to the example embodiments described above. Modifications and alterations will occur to others upon a reading and understanding of this specification. Examples embodiments incorporating one or more aspects of the invention are intended to include all such modifications and alterations insofar as they come within the scope of the appended claims and their equivalents.

What is claimed is:

1. A refrigeration appliance, comprising:
   a cabinet defining a compartment for storing food items in a refrigerated environment; and
   a door for selectively closing at least a portion of the compartment, the door having an inner side facing towards the compartment when the door is in a closed position engaged with the cabinet and an external side disposed opposite thereof, wherein the door comprises:
   a body pivotably coupled to the cabinet and defining a window extending through the body,
   an inner pane of glass at the inner side of the door at the window, said inner pane of glass having a peripheral edge,
   an outer pane of glass at the external side of the door, said outer pane of glass having a rear surface being affixed at a front surface of the body, and at least partially closing the window,
   a user interface disposed in the body,
   an upper body panel extending outwards from the rear surface of the outer pane of glass and being disposed vertically between the peripheral edge of the inner pane of glass and the user interface, and
   a rear body panel spaced from the outer pane of glass and extending from the upper body panel to an intermediate portion of the body,
   wherein the outer pane of glass covers a majority of a front of the door,
   wherein the user interface is positioned adjacent to the rear surface of the outer pane of glass and is visible through the outer pane of glass,
   wherein the user interface is disposed adjacent to the peripheral edge of the inner pane of glass at a location outwards and away from said peripheral edge of the inner pane of glass, and
   wherein the upper body panel, the rear body panel, the outer pane of glass and the intermediate portion of the body collectively define a cavity, and wherein the user interface is disposed within said cavity.

2. The refrigeration appliance of claim 1, wherein the user interface is disposed vertically below the inner pane of glass.

3. The refrigeration appliance of claim 1, wherein at least one space disposed behind the outer pane of glass is vacuum sealed.

4. The refrigeration appliance of claim 1, wherein the outer pane of glass covers the entire window at the front surface of the body.

5. The refrigeration appliance of claim 1, wherein the outer pane of glass is coterminous with top and bottom edges of the front surface of the body.

6. The refrigeration appliance of claim 5, wherein the outer pane of glass further is coterminous with a side edge of the front surface of the body.

7. The refrigeration appliance of claim 1, wherein the inner pane of glass is one pane of an inner glass pack disposed behind the outer pane of glass and comprising a stack of glass planes including the inner pane of glass and one or more additional inner panes of glass.

8. The refrigeration appliance of claim 1, wherein the user interface is configured to activate a light element within the cabinet to provide illumination to at least a portion of the compartment adjacent the door.

9. The refrigeration appliance of claim 1, wherein the user interface includes capacitive elements activated via a user contacting specific areas of a front surface of the outer pane of glass.

10. The refrigeration appliance of claim 1, wherein the user interface is affixed to the rear surface of the outer pane of glass.

11. The refrigeration appliance of claim 1, wherein the body defines a recessed handle.

12. The refrigeration appliance of claim 1, wherein the upper body panel and the rear body panel are integral with one another.

13. The refrigeration appliance of claim 1, further comprising an insulation member disposed within the cavity and interposed between the user interface and the upper body panel and the rear body panel.

14. The refrigeration appliance of claim 1, wherein the user interface is contiguous with the rear surface of the outer pane of glass, and wherein the user interface is spaced from the upper body panel and the rear body panel via an insulation member.

15. A refrigeration appliance, comprising:
   a cabinet defining a compartment for storing food items in a refrigerated environment; and
   a door assembly for selectively closing at least a portion of the compartment, the door assembly comprising:
   an inner door and an outer door provided in a stacked arrangement, the doors being configured such that either only the outer door can be opened, or the inner and outer doors can be jointly opened to obtain access to the compartment,
   wherein the inner door is pivotably coupled to the cabinet for selectively engaging with the cabinet, the inner door having an inner door opening extending therethrough that is in communication with the compartment when the inner door is in a closed position engaged with the cabinet, wherein the outer door is pivotably coupled to at least one of the cabinet or the inner door for selectively engaging an outer side of the inner door to close one side of the inner door opening, wherein the outer door comprises:

an outer door body defining a window extending therethrough that allows for viewing of the compartment through the inner door opening when the door assembly is selectively closed against the cabinet, an inner pane of glass at an inner side of the window, said inner pane of glass having a peripheral edge, an outer pane of glass having a rear surface affixed at an outer front surface of the outer door body and covering the window, a user interface retained within the outer door body and having capacitive elements activated via a user contacting specific areas of a front surface of the outer pane of glass, an upper body panel extending outwards from the rear surface of the outer pane of glass and being disposed vertically between the peripheral edge of the inner pane of glass and the user interface, and a rear body panel spaced from the outer pane of glass and extending from the upper body panel to an intermediate portion of the outer door body, wherein the user interface is positioned adjacent to the rear surface of the outer pane of glass and is visible through the outer pane of glass, wherein the user interface is disposed adjacent to the peripheral edge of the inner pane of glass at a location outwards and away from said peripheral edge of the inner pane of glass, and wherein the upper body panel, the rear body panel, the outer pane of glass and the intermediate portion of the outer door body collectively define a cavity, and wherein the user interface is disposed within said cavity.

16. The refrigeration appliance of claim 15, wherein the user interface is affixed to the rear surface of the outer pane of glass.

17. The refrigeration appliance of claim 15, wherein the user interface is configured to activate a light element within the cabinet to provide illumination to at least a portion of the compartment adjacent the door assembly.

18. The refrigeration appliance of claim 15, wherein the user interface is disposed vertically below the inner pane of glass.

19. A refrigeration appliance, comprising:

a cabinet defining a compartment for storing food items in a refrigerated environment; and a door for selectively closing at least a portion of the compartment, the door having an inner side facing towards the compartment when the door is in a closed position engaged with the cabinet and an external side disposed opposite thereof, wherein the door comprises:

a body pivotably coupled to the cabinet and defining a window extending through the body, an inner pane of glass at the inner side of the door at the window, said inner pane of glass having a peripheral edge, an outer pane of glass at the external side of the door, said outer pane of glass having a rear surface being affixed at a front surface of the body, and at least partially closing the window, a user interface disposed in the body, an upper body panel extending outwards from the rear surface of the outer pane of glass and being disposed vertically between the peripheral edge of the inner pane of glass and the user interface, and a rear body panel spaced from the outer pane of glass and extending from the upper body panel to an intermediate portion of the body, wherein the outer pane covers a majority of a front of the door, wherein the user interface is positioned adjacent to the rear surface of the outer pane of glass and is visible through the outer pane of glass, wherein the user interface is disposed adjacent to the peripheral edge of the inner pane of glass at a location outwards and away from said peripheral edge of the inner pane of glass, and wherein the upper body panel, the rear body panel, the outer pane of glass and the intermediate portion of the body collectively define a cavity, wherein the user interface is disposed within said cavity and is contiguous with the rear surface of the outer pane of glass, and wherein the user interface is spaced from the upper body panel and the rear body panel via an insulation member.

* * * * *